(12) United States Patent
Yi

(10) Patent No.: US 6,461,226 B1
(45) Date of Patent: Oct. 8, 2002

(54) CHEMICAL MECHANICAL POLISHING OF A METAL LAYER USING A COMPOSITE POLISHING PAD

(75) Inventor: Champion Yi, Hsinchu (TW)

(73) Assignees: ProMos Technologies, Inc., Hsinchu (TW); Mosel Vitelic, Inc., Hsinchu (TW); Infineon Technologies AG, Munich (DE)

( * ) Notice: Subject to any disclaimer, the term of this patent is extended or adjusted under 35 U.S.C. 154(b) by 86 days.

(21) Appl. No.: 09/654,661

(22) Filed: Sep. 5, 2000

Related U.S. Application Data (63) Continuation-in-part of application No. 09/200,298, filed on Nov. 25, 1998, now abandoned.

(51) Int. Cl.$^7$ ................................................ B24B 1/00
(52) U.S. Cl. .............................. 451/41; 457/57; 457/59; 457/65; 438/690; 438/700
(58) Field of Search ................ 451/41, 54, 57, 451/59, 63, 65, 66, 287, 288, 290, 461; 438/690, 691, 692, 693, 694, 700, 701

(56) References Cited

U.S. PATENT DOCUMENTS

| | | | | |
|---|---|---|---|---|
| 3,841,031 A | * | 10/1974 | Walsh | 451/288 |
| 5,910,043 A | * | 6/1999 | Manzonie et al. | 451/285 |
| 5,919,082 A | * | 7/1999 | Walker et al. | 451/285 |
| 6,062,958 A | * | 5/2000 | Wright et al. | 451/288 |
| 6,340,326 B1 | * | 1/2002 | Kistler et al. | 451/286 |

* cited by examiner

Primary Examiner—Timothy V. Eley
(74) Attorney, Agent, or Firm—Blakely Sokoloff Taylor & Zafman LLP (57) ABSTRACT

A method of polishing a wafer is disclosed. The wafer has formed thereon an oxide layer that has at least one via. A metal layer is formed on the oxide layer and in the via. The wafer is then polished against an outer portion of a polishing pad until the metal layer outside of the via has been removed. The outer portion has a first hardness. Next, the wafer is polished against an inner portion of the polishing pad. The inner portion of the polishing pad has a second hardness that is less than the first hardness.

20 Claims, 7 Drawing Sheets

CHEMICAL MECHANICAL POLISHING OF A METAL LAYER USING A COMPOSITE POLISHING PAD

RELATED APPLICATION

This is a continuation-in-part of U.S. patent application Ser. No. 09/200,298 filed Nov. 25, 1998 entitled "Composite Polishing Pad" which is now abandoned.

FIELD OF THE INVENTION

The present invention relates to an apparatus used in semiconductor fabrication, and more particularly, to a chemical mechanical polishing pad.

BACKGROUND OF THE INVENTION

Figure 1:
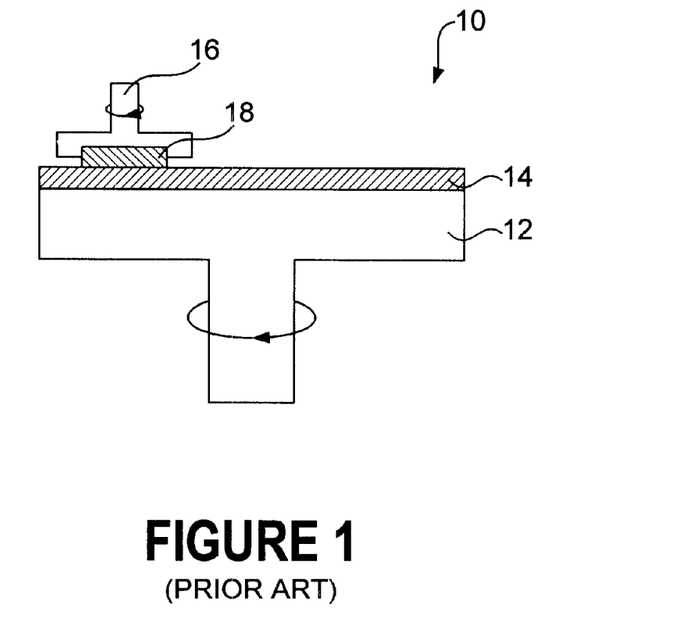
FIG. 1 is a cross-sectional view of a conventional CMP apparatus.
Figure 2:
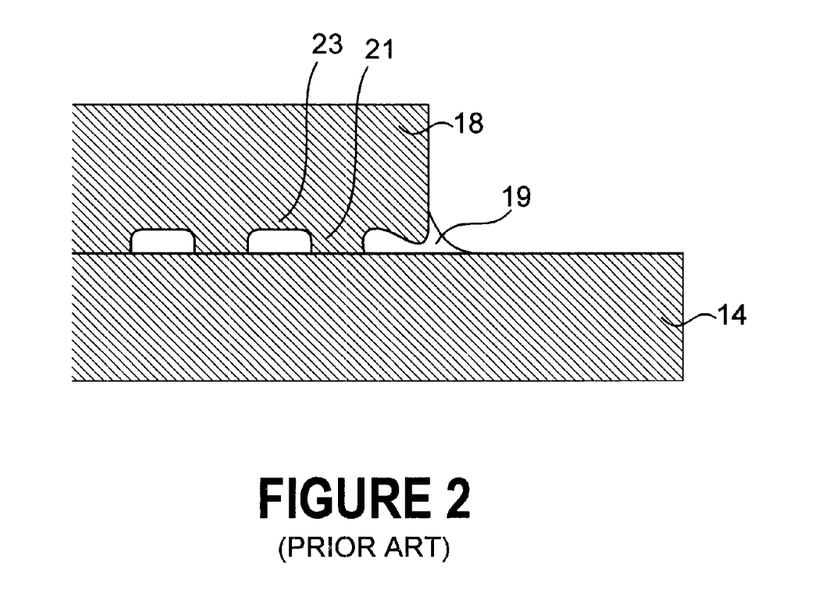
FIG. 2 is an enlarged cross-sectional view of a portion of the conventional CMP apparatus shown in FIG. 1.

During the manufacture of multilayer integrated circuits, it is desirable to effect planarization of the integrated circuit structures in the form of semiconductor wafers. This is usually accomplished by chemical mechanical polishing (CMP). FIG. 1 shows a cross-sectional view of a conventional CMP apparatus 10, which includes a rotating table 12 having a polishing pad 14 disposed thereon, and a wafer carrier 16 that holds a wafer 18. The wafer 18 is held in an inverted position against the polishing pad 14, with the side to be polished against the polishing pad. A predetermined pressure is exerted on the wafer 18 against the polishing pad 14. As shown in FIG. 2, an enlarged cross-sectional view, a slurry 19 is applied between the wafer 18 and the polishing pad 14. In operation, the polishing pad 14 and the wafer 18 rotate in relation to one another. The wafer is polished by mechanical abrasion from the polishing pad 14 and particles in the slurry 19 and by chemical action from the slurry 19 on the polishing pad 14. Apparatus for polishing semiconductor wafers are well-known in the art. Such planarization apparatus are manufactured by IPEC Planar and the SpeedFam Corporation among others.

In a typical CMP process, two polishing pads are used. The semiconductor wafer is first polished by using a hard pad on a primary rotating table. The hard pad planarizes the wafer surface by removing material on higher raised areas 21 faster than in lower areas 23. The wafer is then polished by using a soft pad and a lower downward force on a secondary rotating table. The soft pad removes any residual material or slurry residue on the wafer surface and improves the with-in-wafer uniformity of the wafer. During the CMP process, the CMP apparatus will generate, either chemically or mechanically, unwanted particles that degrade the performance of the circuits. When the wafer is transferred from the primary table to the secondary table, the slurry becomes dry and hard due to contact with the air. A cleaning step is required. The cleaning step may include scrubbing, rinsing and spin-drying. This cleaning step undesirably reduces production efficiency. Moreover, the transferring of the wafer between the primary table and the secondary table creates the potential for contamination of the clean environment necessary during wafer fabrication.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a polishing pad 20 for use in conjunction with a chemical mechanical polishing (CMP) apparatus to polish a semiconductor wafer. The polishing pad according to the present invention eliminates the need for the use of a hard polishing pad followed by the use of a separate soft polishing pad.

Figure 3:
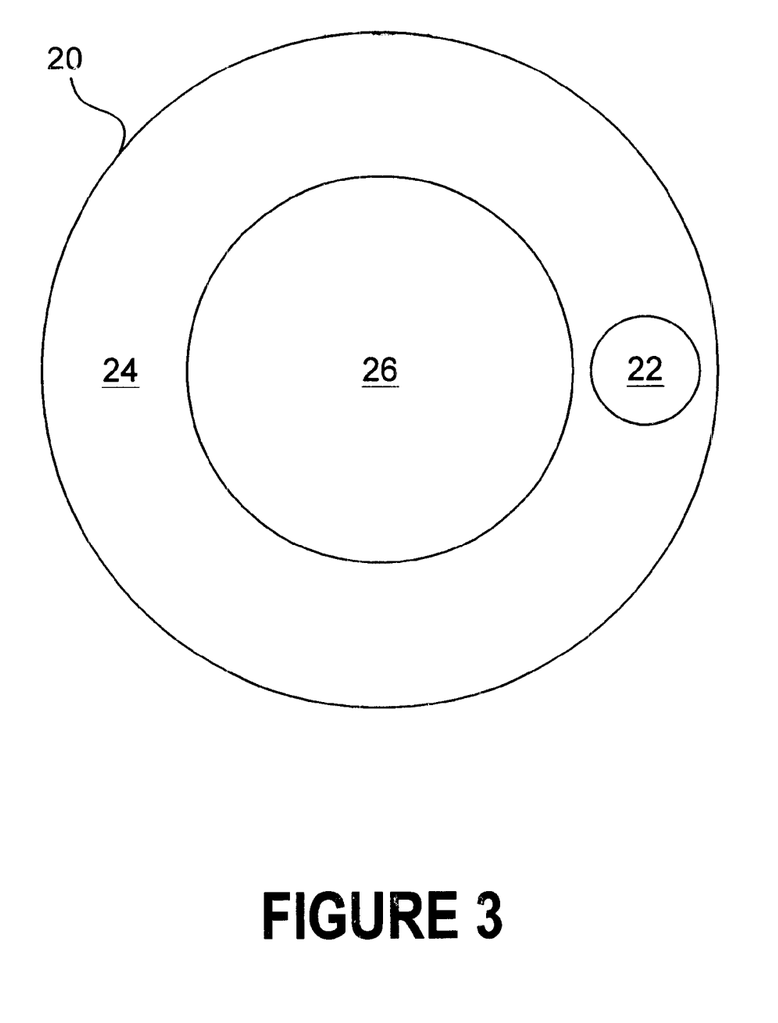
FIG. 3 is a top view of a wafer carrier, and a polishing pad according to the present invention.

Referring to FIG. 3, the polishing pad 20 includes an outer ring portion 24 and an inner ring portion 26. The outer ring portion 24 is composed of a hard pad material, such as polyurethane and foam or the material used in a Rodel IC1000/Suba IV pad. The outer ring portion 24 is preferably between 20–36 inches in outside diameter and 20 inches in inside diameter. The inner ring portion 26 is composed of a soft pad material, such as the material used in a Rodel Politex embossed pad, and is preferably between 10–20 inches in diameter.

A wafer carrier 22 positions the semiconductor wafer against the outer ring portion 24 of the polishing pad 20. The wafer is polished by the outer ring portion 24 of the polishing pad 20. Polishing by rotation of the polishing pad 20 and the wafer and by the use of a slurry is well-known in the art and will not be discussed further herein. The wafer carrier 22 then transfers the wafer to the inner ring portion 26 of the polishing pad 20. The wafer is then polished by the inner ring portion 26 of the polishing pad 20.

Alternatively, the outer ring portion 24 may be composed of a soft pad material and the inner ring portion 26 may be composed of a hard pad material. In such case, the wafer is first polished by the inner ring portion 24 and is then moved to the outer ring portion 26 for polishing. However, it is preferable to use a hard pad material on the outer ring portion 24 and a soft pad material for the inner ring portion 26 for purposes of preventing cross contamination by the slurry, as discussed below.

Centrifugal force generated by rotation of the polishing pad prevents slurry cross contamination. During polishing by the outer ring portion 24, the slurry is added to the outer ring portion 24. Centrifugal force prevents the slurry from contacting the inner ring portion 26.

Figure 4:
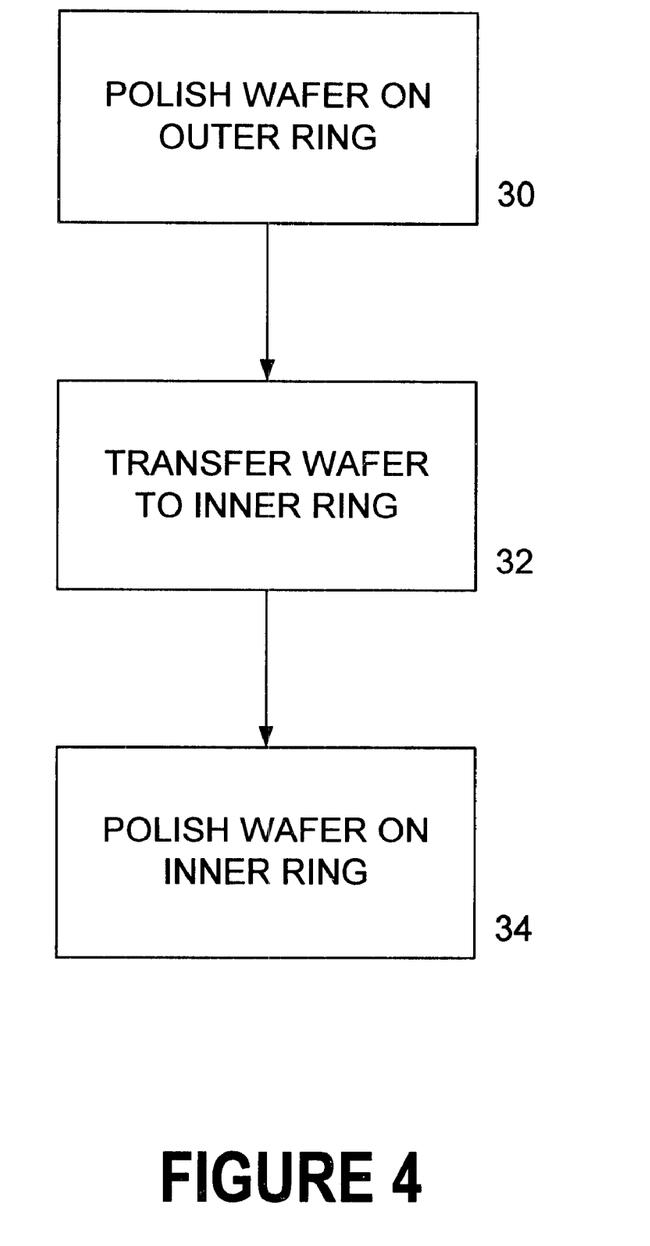
FIG. 4 is a flow chart illustrating the steps of polishing a wafer using a polishing pad of the present invention.

FIG. 4 illustrates the steps of polishing the semiconductor wafer using the polishing pad of the present invention. At step 30, the wafer is polished against the outer ring portion 24 of the polishing pad 20. At step 32, the wafer carrier 22 transfers the wafer to the inner ring portion 26 of the polishing pad 20. At step 34, the wafer is polished against the inner ring portion of the polishing pad.

Figure 5:
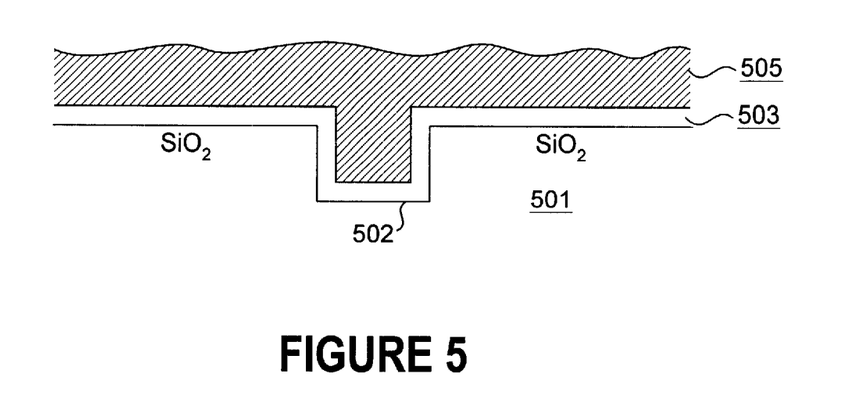
FIGS. 5–7 are cross sectional views of a semiconductor substrate undergoing polishing in accordance with the present invention.
Figure 6:
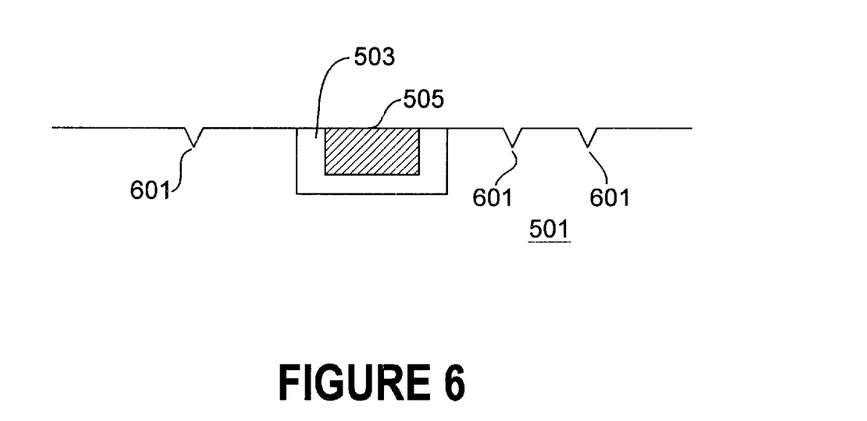
Figure 7:
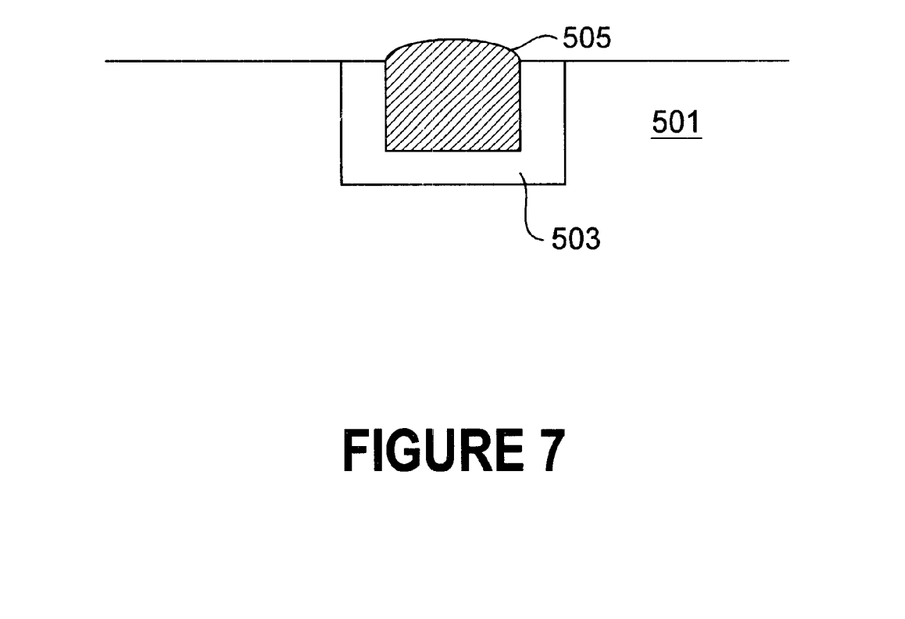

Turning to FIGS. 5–7, a specific application of the present invention is described. First, in FIG. 5 a silicon dioxide layer

501 is shown. The silicon dioxide layer 501 is typically an intermetal or interlayer dielectric formed on a semiconductor substrate. The silicon dioxide layer 501 can be borophosphosilicate glass (BPSG), tetraorthoethylsilicate (TEOS), spin-on-glass (SOG), or chemical vapor deposition (CVD) oxide.

Formed in the silicon oxide layer is a contact via 502. The via 502 may be, for example, formed during a damascene procedure. The via 502 can be formed using conventional photolithography patterning and etching.

Next, a liner layer 503 is formed over the silicon dioxide layer 501 and into the via 502. The liner layer 503 is preferably formed from a titanium/titanium nitride material or tantalum/tantalum nitride. The liner layer 503 can be formed using chemical vapor deposition or by sputtering.

Finally, a metal layer 505 is deposited over the liner layer 503. The metal layer 505 is preferably tungsten or copper that is formed by chemical vapor deposition. In the case of tungsten, the thickness of the metal layer 505 is about 0.3 to 0.6 microns. In the case of copper, the thickness of the metal layer 505 is about 0.5 to 1.0 microns.

Next, turning to FIG. 6, in accordance with the present invention, a first chemical mechanical polishing step is performed. In particular, the semiconductor wafer is polished on the outer ring portion 24 for between 1–5 minutes to remove the tungsten or copper that is outside of the via 502. However, because the outer ring portion 24 is relatively hard, scratches 601 are formed in the silicon dioxide layer. Therefore, the semiconductor wafer is moved to the inner ring portion 26 of the composite polishing pad 20. The semiconductor wafer is polished on the inner ring portion for between 30 seconds and 2 minutes to remove the scratches or correct any dishing of the remaining tungsten or copper material. The resulting structure is shown in FIG. 7.

Figure 8:
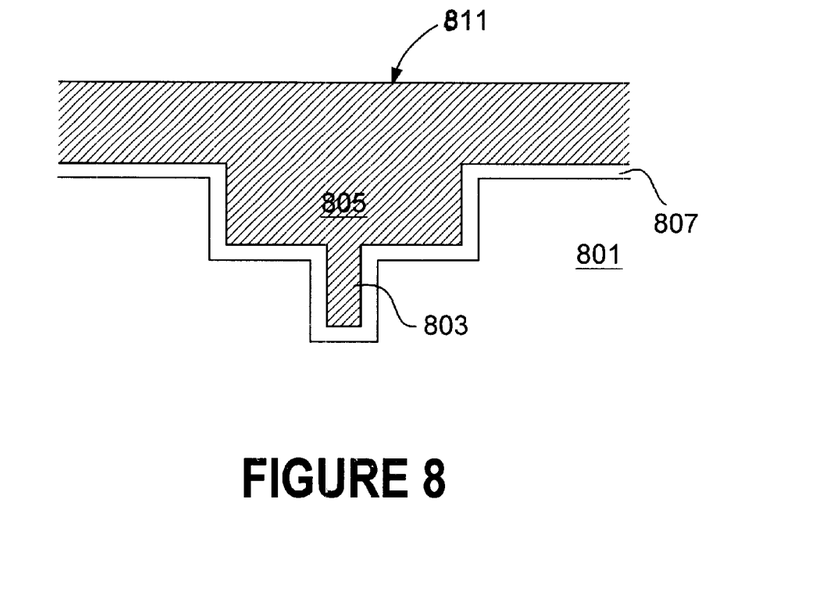
FIGS. 8–10 are cross sectional views of a semiconductor substrate undergoing polishing in accordance with the present invention.
Figure 9:
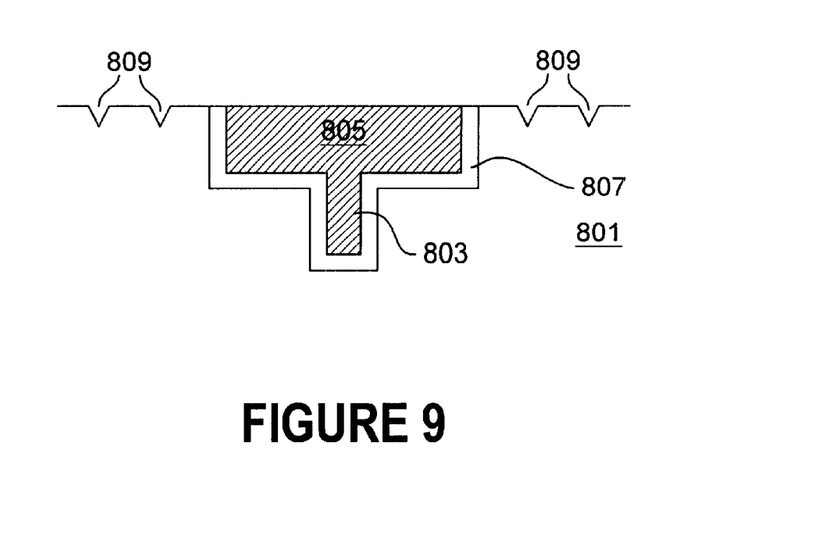
Figure 10:
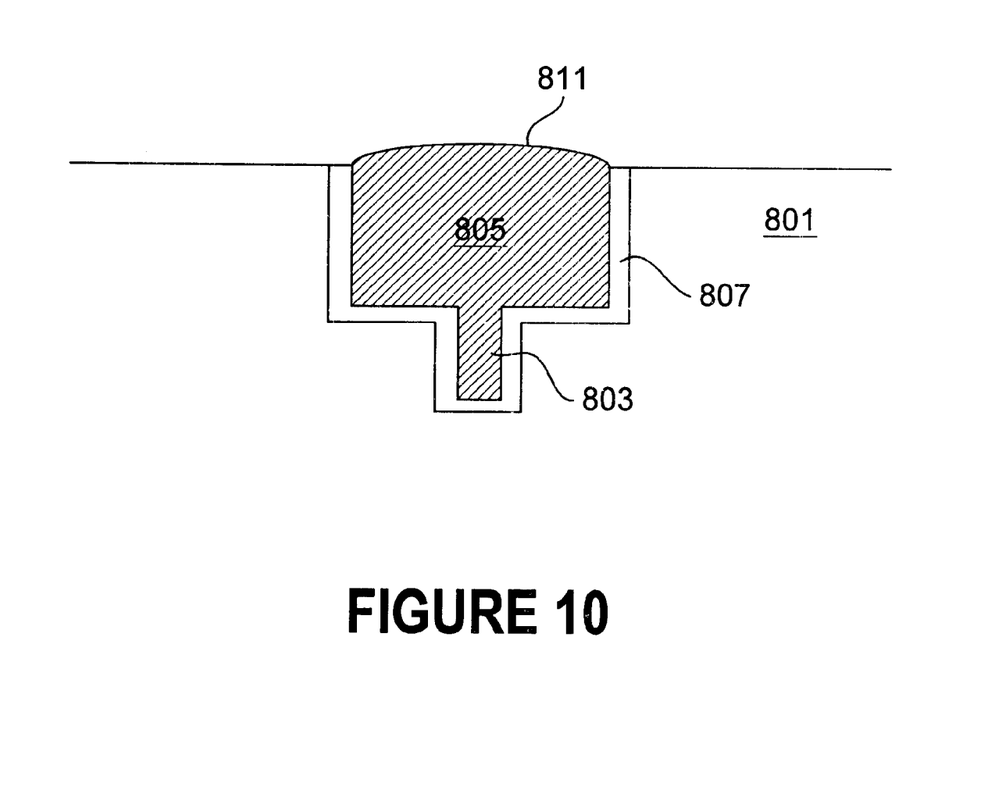

Additionally, the method of the present invention can also be used in a dual damascene process. This is seen in FIGS. 8–10. First, in FIG. 8, a silicon dioxide layer 801 is shown. The silicon dioxide layer 801 is typically an intermetal or interlayer dielectric formed on a semiconductor substrate. The silicon dioxide layer 801 can be borophosphosilicate glass (BPSG), tetraorthoethylsilicate (TEOS), spin-on-glass (SOG), or chemical vapor deposition (CVD) oxide.

Formed in the silicon oxide layer is a contact via 803 and trench structure 805. The via 803 and trench 805 may be, for example, formed during a dual damascene procedure. The via 803 is used to form a conductive plug to an underlying metal layer. The trench 805 forms an overlying metal interconnect structure. The via 803 and trench 805 can be formed using conventional photolithography patterning and etching commonly used to form dual damascene structures.

Next, a liner layer 807 is formed over the silicon dioxide layer 801 and into the via 803 and trench 805. The liner layer 807 is preferably formed from a titanium/titanium nitride material or tantalum/tantalum nitride. The liner layer 807 can be formed using chemical vapor deposition or by sputtering.

Finally, a metal layer 811 is deposited over the liner layer 807. The metal layer 811 is preferably tungsten or copper that is formed by chemical vapor deposition. In the case of tungsten, the thickness of the metal layer 811 is about 0.3 to 0.6 microns. In the case of copper, the thickness of the metal layer 811 is about 0.5 to 1.0 microns.

Next, turning to FIG. 9, in accordance with the present invention, a first chemical mechanical polishing step is performed. In particular, the semiconductor wafer is polished on the outer ring portion 24 for between 1–5 minutes to remove the tungsten or copper that is outside of the trench 805. However, because the outer ring portion 24 is relatively hard, scratches 809 are formed in the silicon dioxide layer. Therefore, the semiconductor wafer is moved to the inner ring portion 26 of the composite polishing pad 20. The semiconductor wafer is polished on the inner ring portion for between 30 seconds and 2 minutes to remove the scratches or correct any dishing of the remaining tungsten or copper material. The resulting structure is shown in FIG. 10.

While the preferred embodiment of the invention has been illustrated and described, it will be appreciated that various changes can be made therein without departing from the spirit and scope of the invention.

What is claimed is:

1. A method of polishing a wafer carrying a metal layer that is formed over an oxide layer, said metal layer extending into a via in said oxide layer, the method comprising:
    polishing said wafer against a first portion of a polishing pad until said metal layer outside of said via has been removed and said oxide layer has been reached, said first portion having a first hardness;
    transferring the wafer to a second portion of the polishing pad; and
    polishing the wafer against the second portion of the polishing pad, wherein the second portion has a second hardness that is less than said first hardness.

2. The method of claim 1 wherein said metal layer is selected from the group of tungsten or copper.

3. The method of claim 2 wherein said polishing of said wafer on said outer portion is for between 1 to 5 minutes.

4. The method of claim 3 wherein said polishing of said wafer on said inner portion is for between 30 seconds and 2 minutes.

5. The method of claim 1 wherein said first portion of said polishing pad is an inner portion of said polishing pad and said second portion of said polishing pad is an outer portion of said polishing pad.

6. The method of claim 1 wherein said second portion of said polishing pad is an inner portion of said polishing pad and said first portion of said polishing pad is an outer portion of said polishing pad.

7. The method of claim 5 wherein said polishing pad is substantially circular and said outer portion of said polishing pad is an annular ring and said inner portion is inside said annular ring.

8. The method of claim 6 wherein said polishing pad is substantially circular and said outer portion of said polishing pad is an annular ring and said inner portion is inside said annular ring.

9. A method of polishing a wafer carrying a metal layer that is formed over an oxide layer, said metal layer extending into a dual damasacene structure comprising a trench and a via in said oxide layer, the method comprising:
    polishing said wafer against a first portion of a polishing pad until said metal layer outside of said trench has been removed and said oxide layer has been reached, said first portion having a first hardness;
    transferring the wafer to a second portion of the polishing pad; and
    polishing the wafer against the second portion of the polishing pad, wherein the second portion has a second hardness that is less than said first hardness.

10. The method of claim 9 wherein said metal layer is selected from the group of tungsten or copper.

11. The method of claim 10 wherein said polishing of said wafer on said outer portion is for between 1 to 5 minutes.

12. The method of claim 11 wherein said polishing of said wafer on said inner portion is for between 30 seconds and 2 minutes.

13. The method of claim 9 wherein said first portion of said polishing pad is an inner portion of said polishing pad and said second portion of said polishing pad is an outer portion of said polishing pad.

14. The method of claim 9 wherein said second portion of said polishing pad is an inner portion of said polishing pad and said first portion of said polishing pad is an outer portion of said polishing pad.

15. The method of claim 13 wherein said polishing pad is substantially circular and said outer portion of said polishing pad is an annular ring and said inner portion is inside said annular ring.

16. The method of claim 14 wherein said polishing pad is substantially circular and said outer portion of said polishing pad is an annular ring and said inner portion is inside said annular ring.

17. A method of forming a conducting layer in an oxide layer formed on a wafer, the method comprising:

depositing an oxide layer onto said wafer;

patterning and etching a via in said oxide layer;

forming a metal layer over said oxide layer and in said via;

polishing said wafer against an outer portion of a polishing pad until said metal layer outside of said via has been removed and said oxide layer has been reached, said outer portion having a first hardness;

transferring the wafer to an inner portion of the polishing pad; and polishing the wafer against the inner portion of the polishing pad, wherein the inner portion has a second hardness that is less than said first hardness.

18. The method of claim 17 wherein said metal layer is selected from the group of tungsten or copper.

19. The method of claim 18 wherein said polishing of said wafer on said outer portion is for between 1 to 5 minutes.

20. The method of claim 19 wherein said polishing of said wafer on said inner portion is for between 30 seconds and 2 minutes.

* * * * *